United States Patent
Torek

(10) Patent No.: US 11,276,613 B2
(45) Date of Patent: Mar. 15, 2022

(54) METHODS OF FORMING SEMICONDUCTOR STRUCTURES COMPRISING THIN FILM TRANSISTORS INCLUDING OXIDE SEMICONDUCTORS

(71) Applicant: Micron Technology, Inc., Boise, ID (US)

(72) Inventor: Kevin J. Torek, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 16/917,379

(22) Filed: Jun. 30, 2020

(65) Prior Publication Data

US 2020/0335405 A1    Oct. 22, 2020

Related U.S. Application Data

(63) Continuation of application No. 16/114,614, filed on Aug. 28, 2018, now Pat. No. 10,714,400.

(Continued)

(51) Int. Cl.
*H01L 21/84*  (2006.01)
*H01L 21/8238*  (2006.01)
(Continued)

(52) U.S. Cl.
CPC ............. *H01L 21/823885* (2013.01); *H01L 21/02565* (2013.01); *H01L 21/308* (2013.01);
(Continued)

(58) Field of Classification Search
CPC ............. H01L 21/823885; H01L 21/84; H01L 21/02565; H01L 21/308; H01L 21/823828;
(Continued)

(56) References Cited

U.S. PATENT DOCUMENTS 6,424,001 B1   7/2002   Forbes et al.
7,767,106 B2   8/2010   Chang
(Continued)

FOREIGN PATENT DOCUMENTS

JP    H11-162941 A    6/1999
JP    2012-256847 A   12/2012
(Continued)

OTHER PUBLICATIONS

Korean First Notice of Reasons for Rejection for Application No. 10-2021-7014279, dated Jun. 29, 2021, 6 pages.

(Continued)

*Primary Examiner* — Shouxiang Hu
(74) *Attorney, Agent, or Firm* — TraskBritt

(57) ABSTRACT

A method of forming a semiconductor structure comprises forming an array of vertical thin film transistors. Forming the array of vertical thin film transistors comprises forming a source region, forming a channel material comprising an oxide semiconductor material over the source region, exposing the channel material to a dry etchant comprising hydrogen bromide to pattern the channel material into channel regions of adjacent vertical thin film transistor structures, forming a gate dielectric material on sidewalls of the channel regions, forming a gate electrode material adjacent to the gate dielectric material, and forming a drain region over the channel regions. Related methods of forming semiconductor structures and an array of memory cells are also disclosed.

21 Claims, 13 Drawing Sheets

Related U.S. Application Data

(60) Provisional application No. 62/552,159, filed on Aug. 30, 2017.

(51) Int. Cl.
| | |
|---|---|
| *H01L 29/66* | (2006.01) |
| *H01L 27/088* | (2006.01) |
| *H01L 29/08* | (2006.01) |
| *H01L 29/10* | (2006.01) |
| *H01L 29/786* | (2006.01) |
| *H01L 29/423* | (2006.01) |
| *H01L 21/822* | (2006.01) |
| *H01L 27/06* | (2006.01) |
| *H01L 27/108* | (2006.01) |
| *H01L 21/02* | (2006.01) |
| *H01L 21/308* | (2006.01) |

(52) U.S. Cl.
CPC .. *H01L 21/8221* (2013.01); *H01L 21/823828* (2013.01); *H01L 21/84* (2013.01); *H01L 27/0688* (2013.01); *H01L 27/088* (2013.01); *H01L 27/10814* (2013.01); *H01L 27/10873* (2013.01); *H01L 27/10897* (2013.01); *H01L 29/0847* (2013.01); *H01L 29/1033* (2013.01); *H01L 29/42384* (2013.01); *H01L 29/66742* (2013.01); *H01L 29/7869* (2013.01); *H01L 29/78618* (2013.01); *H01L 29/78642* (2013.01); *H01L 29/78696* (2013.01)

(58) Field of Classification Search
CPC ......... H01L 29/66742; H01L 27/10873; H01L 27/10814; H01L 27/10897; H01L 27/0688; H01L 21/8221; H01L 29/42384; H01L 29/7869; H01L 29/78696; H01L 29/78618; H01L 29/78642; H01L 29/1033; H01L 29/0847; H01L 27/088; H01L 29/66666; H01L 29/7827; H01L 27/2454

See application file for complete search history.

(56) References Cited

U.S. PATENT DOCUMENTS

| | | |
|---|---|---|
| 9,397,145 B1 | 7/2016 | Sills et al. |
| 9,685,447 B2 | 6/2017 | Yamazaki et al. |
| 9,711,650 B2 | 7/2017 | Shimabukuro |
| 9,754,665 B2 | 9/2017 | Chen et al. |
| 10,037,397 B2 * | 7/2018 | Moroz ............... H01L 29/0676 |
| 10,304,959 B2 | 5/2019 | Shi |
| 2006/0175609 A1 | 8/2006 | Chan et al. |
| 2007/0007601 A1 | 1/2007 | Hsu et al. |
| 2013/0230955 A1 | 9/2013 | Chen et al. |
| 2014/0103471 A1 | 4/2014 | Lupino et al. |
| 2015/0249143 A1 | 9/2015 | Sano et al. |
| 2015/0348976 A1 | 12/2015 | Moon et al. |
| 2016/0155855 A1 | 6/2016 | Ramaswamy et al. |
| 2017/0179132 A1 | 6/2017 | Ieda et al. |
| 2019/0067437 A1 | 2/2019 | Ramaswamy et al. |

FOREIGN PATENT DOCUMENTS

| | | |
|---|---|---|
| KR | 10-2009-0017046 A | 2/2009 |
| KR | 10-0889607 B1 | 3/2009 |
| KR | 10-2014-0082844 A | 7/2014 |

OTHER PUBLICATIONS

Korean Notice of Rejection for Application No. 10-2020-7008923, dated Dec. 21, 2020, 10 pages.

Nomura et al., "Thin-film transistor fabricated in single crystalline transparent oxide semiconductor", Science vol. 300, May 23, 2003.

Heineck, Daniel Philip, Zinc Tin Oxide Thin-Film Transistor Circuits, Master of Schience thesis submitted to Oregon State University Dec. 10, 2008. 97 pages.

International Search Report from International Application No. PCT/US2018/048456, dated Dec. 14, 2018, 3 pages.

International Written Opinion from International Application No. PCT/US2018/048456, dated Dec. 14, 2018, 4 pages.

* cited by examiner

METHODS OF FORMING SEMICONDUCTOR STRUCTURES COMPRISING THIN FILM TRANSISTORS INCLUDING OXIDE SEMICONDUCTORS

CROSS-REFERENCE TO RELATED APPLICATION

This application is a continuation of U.S. patent application Ser. No. 16/114,614, filed Aug. 28, 2018, now U.S. Pat. No. 10,714,400, issued on Jul. 14, 2020, and titled "METHODS OF FORMING SEMICONDUCTOR STRUCTURES COMPRISING THIN FILM TRANSISTORS INCLUDING OXIDE SEMICONDUCTORS," which claims the benefit under 35 U.S.C. § 119(e) of U.S. Provisional Patent Application Ser. No. 62/552,159, filed Aug. 30, 2017, and titled "METHODS OF FORMING SEMICONDUCTOR STRUCTURES COMPRISING THIN FILM TRANSISTORS INCLUDING OXIDE SEMICONDUCTORS," the disclosure of each of which is hereby incorporated herein in its entirety by this reference.

TECHNICAL FIELD

Embodiments disclosed herein relate to methods of forming semiconductor structures including vertical thin film transistors comprising oxide semiconductors, and to related semiconductor structures. More particularly, embodiments of the disclosure relate to methods of forming semiconductor structures comprising an array of vertical thin film transistors having a channel region which, in some embodiments, may comprise an oxide, methods of patterning the vertical thin film transistors, and to related semiconductor structures.

BACKGROUND

Conventional volatile memory cells, such as dynamic random access memory (DRAM) cells, may include a storage element and a transistor. The storage element may, for example, include a capacitor (e.g., sometimes referred to as a "cell capacitor" or a "storage capacitor") configured to store a logical state (e.g., a binary value of either a "0" or a "1") defined by the storage charge in the capacitor. The transistor may be referred to in the art as an "access transistor." The transistor conventionally includes a channel region between a pair of source/drain regions and further includes a gate configured to electrically connect the source/drain regions to one another through the channel region. The channel region conventionally includes a semiconductor material, such as silicon.

To charge, discharge, read, or recharge the capacitor, the transistor may be selectively turned to an "on" state, in which current flows between the source and drain regions through the channel region of the transistor. The transistor may be selectively turned to an "off" state, in which the flow of current is substantially stopped. In the off state, it is desired for the capacitor to retain the charge, without change. However, capacitors of conventional volatile memory cells may exhibit discharges of current over time and a resulting loss in stored charge. Therefore, even in the "off" state when the memory cell is unselected, current may flow from the capacitor. This off-state leakage current is referred to in the art as a sub-threshold leakage current.

Due to sub-threshold leakage current, conventional volatile memory cells are frequently refreshed. The sub-threshold leakage current may also impact the fabrication and configuration of an array of memory cells within a memory device. Sub-threshold leakage current rates, refresh rates, cell size, and thermal budgets of memory cells are often important considerations in the design, fabrication, and use of volatile memory cells and arrays of cells incorporated in memory devices.

Methods of forming channel regions often include etching the channel regions of such structures with a wet etchant such as oxalic acid. However, the use of such etchants often forms a residue on such structures. The residue left behind by such etchants may change the material properties of the channel regions. In addition, wet etchants are often unable to achieve a desirably high packing density of the structures being patterned.

DETAILED DESCRIPTION

Figure 1:
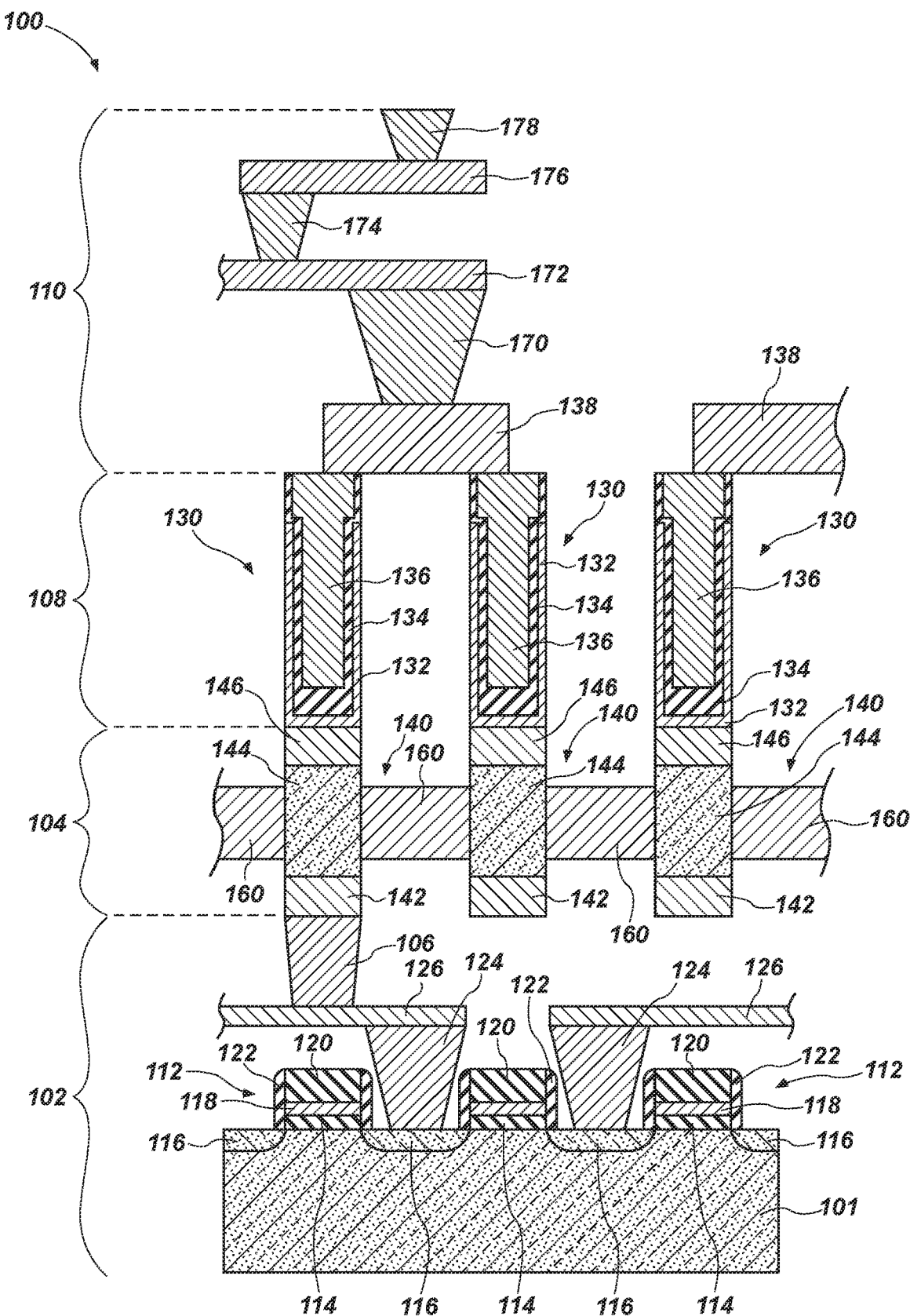
FIG. 1 is a simplified cross-sectional view of a semiconductor structure, in accordance with some embodiments of the disclosure.

The illustrations included herewith are not meant to be actual views of any particular systems or semiconductor structures, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure including vertical thin film transistors comprising an oxide semiconductor, or a complete description of a process flow for manufacturing such semiconductor structures. The structures described below do not form a complete vertical thin film transistor or semiconductor structure. Only those process acts and structures necessary to understand the embodiments described herein are described in detail below. Additional acts to form a complete semiconductor structure or vertical thin film transistors including an oxide semiconductor described herein may be performed by conventional techniques.

According to embodiments disclosed herein, a semiconductor structure includes an array of memory cells and vertical thin film transistors. The vertical thin film transistors may include a channel region formed between a source region and a drain region. In some embodiments, the channel region may include an oxide semiconductor material. Such channel regions including the oxide semiconductor material may exhibit a reduced amount of off-stake leakage and may exhibit a lower off-state current than conventional materials. The vertical thin film transistors may be formed by etching the material of the channel region with a dry etchant, such as is employed in reactive ion etching (RIE). The dry etchant may include hydrogen bromide and a carrier gas. In some embodiments, the dry etchant further includes one or more of an alkane (e.g., methane), hydrogen, nitrogen trifluoride, and oxygen. Such dry etchant facilitates formation of the vertical thin film transistors comprising the oxide semiconductor material with a packing density greater than that achievable with other etching methods. For example, the array of thin film transistors may be formed having a pitch between about 10 nm and about 40 nm in a first direction, and a pitch of between about 20 nm and about 50 nm in a second direction, substantially perpendicular to the first direction. Thus, the vertical thin film transistors formed according to embodiments of the disclosure may be used in ultra large-scale integration or high density memory circuits. The channel regions of the vertical thin film transistors may have sidewalls that are substantially perpendicular (i.e., sidewalls oriented at an angle of about 90° with respect to a major surface of the semiconductor structure). The vertical thin film transistors formed according to such methods may be substantially free of any residue materials formed during etching of the channel regions and the material properties of the channel region materials may be substantially unaffected by the etchants used to etch such materials. The method of etching the channel material facilitates formation of smooth lines and clean surfaces of the channel regions, and facilitates formation of the array of vertical thin film transistors with a narrow pitch and spacing.

FIG. 1 is a simplified cross-sectional view of a semiconductor device 100, in accordance with some embodiments of the disclosure. The semiconductor device 100 may include a logic circuitry region 102, a transistor region 104 connected to the logic circuitry region 102 with, for example, a conductive interconnect 106, a capacitor region 108 in communication with the transistor region 104, and an interconnect region 110 over the capacitor region 108. The capacitor region 108 may include storage capacitors associated with memory cells and may be configured to store a logic value of the memory cell with which it is associated. The interconnect region 110 may include interconnect circuitry for electrically coupling the semiconductor structure and components thereof to one or more other components of the semiconductor device 100. The interconnect region 110 may include one or more conductive materials.

The logic circuitry region 102 may be formed on or in a substrate 101. The substrate 101 may be a base material or a construction upon which additional materials are formed. The substrate 101 may be a semiconductor substrate, a base semiconductor layer on a supporting structure, a metal electrode or a semiconductor substrate having one or more layers, structures or regions formed thereon. The substrate 101 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate 101 may be doped or undoped.

The logic circuitry region 102 may include complementary metal oxide semiconductor (CMOS) circuitry at the substrate level. By way of nonlimiting example, planar transistor structures 112 (e.g., NMOS transistor structures, PMOS transistor structures, etc.) are arranged over the substrate 101. The planar transistor structures 112 may include one or more gate dielectric materials 114 extending between source/drain regions 116. A gate electrode material 118 may overlie the gate dielectric material 114 and may be configured to be in electrical communication with one or more components of the semiconductor device 100. The gate electrode material 118 may include a conductive material, such as titanium nitride (TiN), copper, tungsten, tungsten nitride (WN), molybdenum, polysilicon, other conductive materials, or combinations thereof. A cap material 120 may overlie the gate electrode material 118. The cap material 120 may include an insulative material, such as, for example, silicon dioxide, silicon nitride, or a combination thereof. Sidewall spacers 122 may be on sidewalls of the planar transistor structures 112. The sidewall spacers 122 may include an insulative material, such as, for example, silicon dioxide, silicon nitride, or a combination thereof.

A conductive interconnect 124 may electrically couple one of the source/drain regions 116 of at least some of the planar transistor structures 112 to the conductive interconnect 106, which, in turn, may be coupled to the transistor region 104. The conductive interconnect 124 may be in electrical communication with the conductive interconnect 106 through, for example, a conductive line 126.

The capacitor region 108 may include capacitor structures 130, each including a first electrode 132 in contact with the transistor region 104, a dielectric material 134 in contact with the first electrode 132, and a second electrode 136 in contact with the dielectric material 134. Accordingly, the dielectric material 134 may be disposed between the first electrode 132 and the second electrode 136. The second electrode 136 may be in electrical communication with the interconnect region 110 through one or more conductive interconnects, such as conductive interconnect 138.

The first electrode 132 and the second electrode 136 may include a conductive material, such as a metal, a metal alloy, a conductive metal oxide, a conductive metal nitride, a conductive metal silicide, a conductively doped semiconductor material, or combinations thereof. The first electrode 132 and the second electrode 136 may independently comprise, for example, at least one of W, WN, Ni, Ta, TaN, TaSi, Pt, Cu, Ag, Au, Al, Mo, Ti, TiN, TiSi, TiSiN, TiAlN, MoN, Ir, IrOx, Ru, RuO$_x$, and conductively doped silicon.

The dielectric material 134 may include suitable dielectric materials for retaining a charge of the capacitor. In some embodiments, the dielectric material 134 comprises a ferroelectric material, such as ferroelectric hafnium oxide, ferroelectric zirconium oxide, lead zirconate titanate (PZT), barium strontium titanate, a high-k dielectric material, or combinations thereof. In some embodiments, the dielectric material 134 may include a dopant, such as one or more of silicon, aluminum, lanthanum, yttrium, erbium, calcium, magnesium, strontium, a rare earth element, or combinations thereof. The dielectric material 134 may be configured to store a charge or other property associated with a logic state of a memory cell associated with the capacitor structure 130. Accordingly, the capacitor structure 130 may be referred to as a "cell capacitor" or a "storage capacitor."

Although FIG. 1 illustrates the capacitor structure 130 as comprising a trench capacitor, the disclosure is not so limited. In other embodiments, the capacitor structure 130 may comprise a capacitor other than a trench capacitor. By way of nonlimiting example, the capacitor structure 130 may comprise stacked capacitors.

Conductive interconnects 138 may electrically connect the capacitor structures 130 to the interconnect region 110. The interconnect region 110 may include conductive contacts 170, 174, 178 and conductive lines 172, 176 for electrically connecting the capacitor structures 130 to external circuitry or other components of the semiconductor device 100. The conductive contacts 170, 174, 178 and conductive lines 172, 176 may include conductive materials such as titanium nitride, copper, tungsten, tungsten nitride, molybdenum, polysilicon, other conductive materials, or combinations thereof.

Figure 2A:
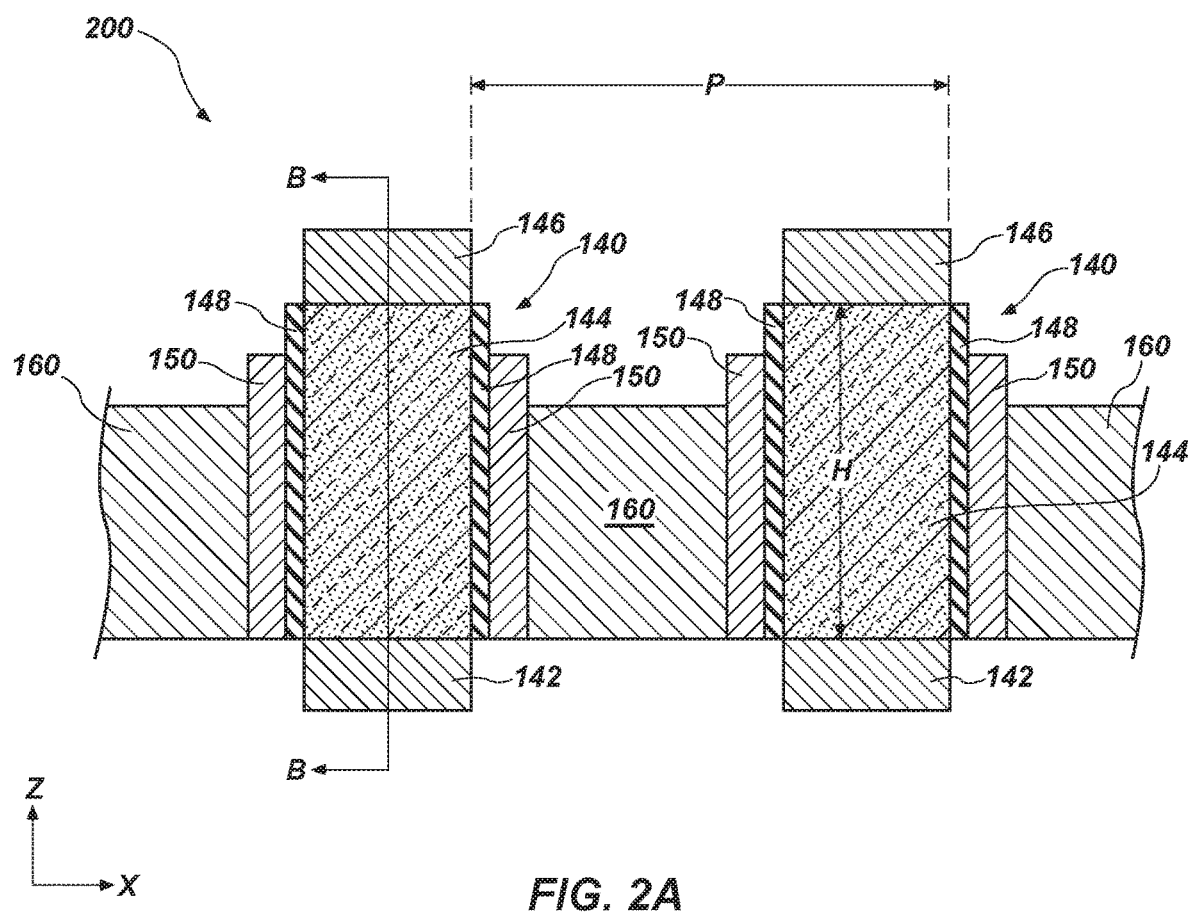
FIG. 2A is a simplified cross-sectional view of an array of vertical thin film transistors, in accordance with some embodiments of the disclosure.

With reference to FIG. 1 and FIG. 2A, the transistor region 104 may include vertical thin film transistors 140, details of which are illustrated in FIG. 2A. The vertical thin film transistors 140 may be arranged in an array 200. Each vertical thin film transistor 140 may include a source region (e.g., a source line) 142 in electrical communication with the conductive interconnect 106 for forming an electrical connection between the vertical thin film transistor 140 and the logic circuitry region 102.

The source region 142 may include a metal, a combination of metals, or regions of different metals. For example, and without limitation, the source region 142 may include titanium nitride, copper, tungsten, tungsten nitride, molybdenum, polysilicon, other conductive materials, or combinations thereof. In some embodiments, the source region 142 comprises tungsten.

A channel region 144 may overlie and be in direct contact with the source region 142. The channel region 144 may include an oxide semiconductor material. By way of nonlimiting example, the oxide semiconductor material may include indium gallium zinc oxide, an amorphous oxide semiconductor material, $ZnO_x$, $InO_x$, $In_2O_3$, $SnO_2$, $TiO_x$, $Zn_xO_yN_z$, $In_xZn_yO_z$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$, InGaSiO, and combinations thereof, wherein each of x, y, z, a, and d are independently real numbers between about 1 and about 10. In other words, each of x, y, z, a, and d may be equal to any value between about 1 and about 10 and may be different than the other of x, y, z, a, and d.

In some embodiments, the channel region 144 comprises indium gallium zinc oxide. Indium gallium zinc oxide may include any composition of indium (In), gallium (Ga), zinc (Zn), and oxygen (O). For example, without limitation, indium gallium zinc oxide may have an In:Ga:Zn:O ratio of 1:1:1:4, may have an $In_2O_3$:$Ga_2O_3$:ZnO ratio of 2:2:1, or may be represented by the formula $InGaO_3(ZnO)_5$. In some embodiments, indium may constitute from about 20 atomic percent to about 60 atomic percent, such as from about 20 atomic percent to about 40 atomic percent, of the gate dielectric material 114, based on the other metal atoms of the gate dielectric material 114. Gallium may constitute from about 20 atomic percent to about 60 atomic percent, such as from about 35 atomic percent to about 55 atomic percent, of the gate dielectric material 114, based on the other metal atoms of the gate dielectric material 114 (i.e., not including oxygen atoms). Zinc may constitute from about 20 atomic percent to about 60 atomic percent, such as from about 20 atomic percent to about 40 atomic percent, of the gate dielectric material 114, based on the other metal atoms of the gate dielectric material 114. In embodiments where the channel region 144 comprises indium gallium zinc oxide, the channel region 144 may exhibit a high ratio of "on" state current to "off" state leakage current. For example, the channel region 144 may exhibit an off-state current leakage of approximately only $1 \times 10^{-24}$ A and an on-to-off current ratio of about 1,000,000,000 to 1. The low off-state leakage current may be conducive for use of the channel region 144 in a memory cell that does not necessitate refreshing more than about once every hour (e.g., once every ten hours, once every twenty-four hours, etc.).

A drain region (e.g., a drain line) 146 may overlie and directly contact the channel region 144. The drain region 146 may include any suitable conductive material formulated and configured to facilitate a flow of current between the drain region 146 and the source region 142 through the channel region 144. The drain region 146 may include a metal, a combination of metals, or regions of different metals. For example, and without limitation, the drain region 146 may include titanium nitride, copper, tungsten, tungsten nitride, molybdenum, polysilicon, other conductive materials, or combinations thereof. In some embodiments, the drain region 146 comprises the same material as the source region 142. In some embodiments, the drain region 146 comprises tungsten.

The drain region 146 may be in electrical communication with the first electrode 132 of the capacitor structure 130 of the capacitor region 108. Accordingly, the vertical thin film transistor 140 may be configured to provide access to the memory material (e.g., the dielectric material 134) of the storage capacitor structure 130.

A gate dielectric material 148 (FIG. 2A) may be on sidewalls of the channel region 144. A gate electrode 150 (FIG. 2A) may be on sidewalls of the gate dielectric material 148 and may be adjacent to the gate dielectric material 148. The gate dielectric material 148 may include a gate insulator material, such as an oxide (e.g., silicon dioxide ($SiO_2$)). In other embodiments, the gate dielectric material 148 may include phosphosilicate glass, borosilicate glass, borophosphosilicate glass (BPSG), fluorosilicate glass, titanium dioxide, zirconium dioxide, hafnium dioxide, tantalum oxide, magnesium oxide, aluminum oxide, or a combination thereof, a nitride material, (e.g., silicon nitride ($Si_3N_4$)), an oxynitride (e.g., silicon oxynitride), or combinations thereof.

The gate electrode 150 may include a conductive material, such as a metal, a metal alloy, a conductive metal oxide, a conductive metal nitride, a conductive metal silicide, a conductively doped semiconductor material, or combinations thereof. By way of nonlimiting example, the gate electrode 150 may include polysilicon, conductively doped silicon, tungsten, tungsten nitride, nickel, tantalum, tantalum nitride, tantalum silicide, platinum, copper, silver, gold, aluminum, molybdenum, titanium, titanium nitride, titanium silicide, titanium aluminum nitride, molybdenum nitride, iridium, iridium oxide, ruthenium, ruthenium oxide, and combinations thereof. In some embodiments, the gate electrode comprises titanium nitride.

The gate electrode 150 may be in electrical communication with a conductive line, such as a conductive word line 160. The conductive word line 160 may extend in rows and electrically connect each vertical thin film transistor 140 of a row of vertical access transistors to each other.

The conductive word line 160 may include a conductive material, such as polysilicon, conductively doped silicon, tungsten, tungsten nitride, nickel, tantalum, tantalum nitride, tantalum silicide, platinum, copper, silver, gold, aluminum, molybdenum, titanium, titanium nitride, titanium silicide, titanium aluminum nitride, molybdenum nitride, iridium, iridium oxide, ruthenium, ruthenium oxide, and combinations thereof. In some embodiments, the conductive word line 160 includes titanium nitride.

In use and operation, an individual vertical thin film transistor 140 may be accessed by applying a voltage through a row associated with the vertical thin film transistor 140 (via the conductive word line 160), and applying a voltage associated with a column of the vertical thin film transistor 140 (e.g., via, for example, a source line associated with, for example, the source region 142). To access a particular vertical thin film transistor 140, a voltage (and a current) may be provided to the gate electrode 150 associated with the vertical thin film transistor 140. Responsive to a sufficient voltage (e.g., a voltage having a magnitude greater than a threshold voltage), a current may flow in the channel region 144 between the source region 142 and the drain region 146 through the vertical thin film transistor 140. Accordingly, the memory material in the capacitor region 108 may be accessed through the vertical thin film transistor 140 responsive to exposure of the gate electrode 150 to the threshold voltage.

A pitch P between adjacent vertical thin film transistors 140 may be between about 10 nm and about 40 nm, such as between about 10 nm and about 15 nm, between about 15 nm and about 20 nm, between about 20 nm and about 25 nm, between about 25 nm and about 30 nm, or between about 30 nm and about 40 nm. The pitch P may be defined as a distance from one feature of a vertical thin film transistor 140 to a similar feature of an adjacent vertical thin film transistor 140. In some embodiments, the pitch P is equal to about 24 nm.

A height H of the channel region 144 may be between about 40 nm and about 100 nm, such as between about 40 nm and about 60 nm, between about 60 nm and about 80 nm, or between about 80 nm and about 100 nm. In some embodiments, the height H is equal to about 80 nm.

Figure 2B:
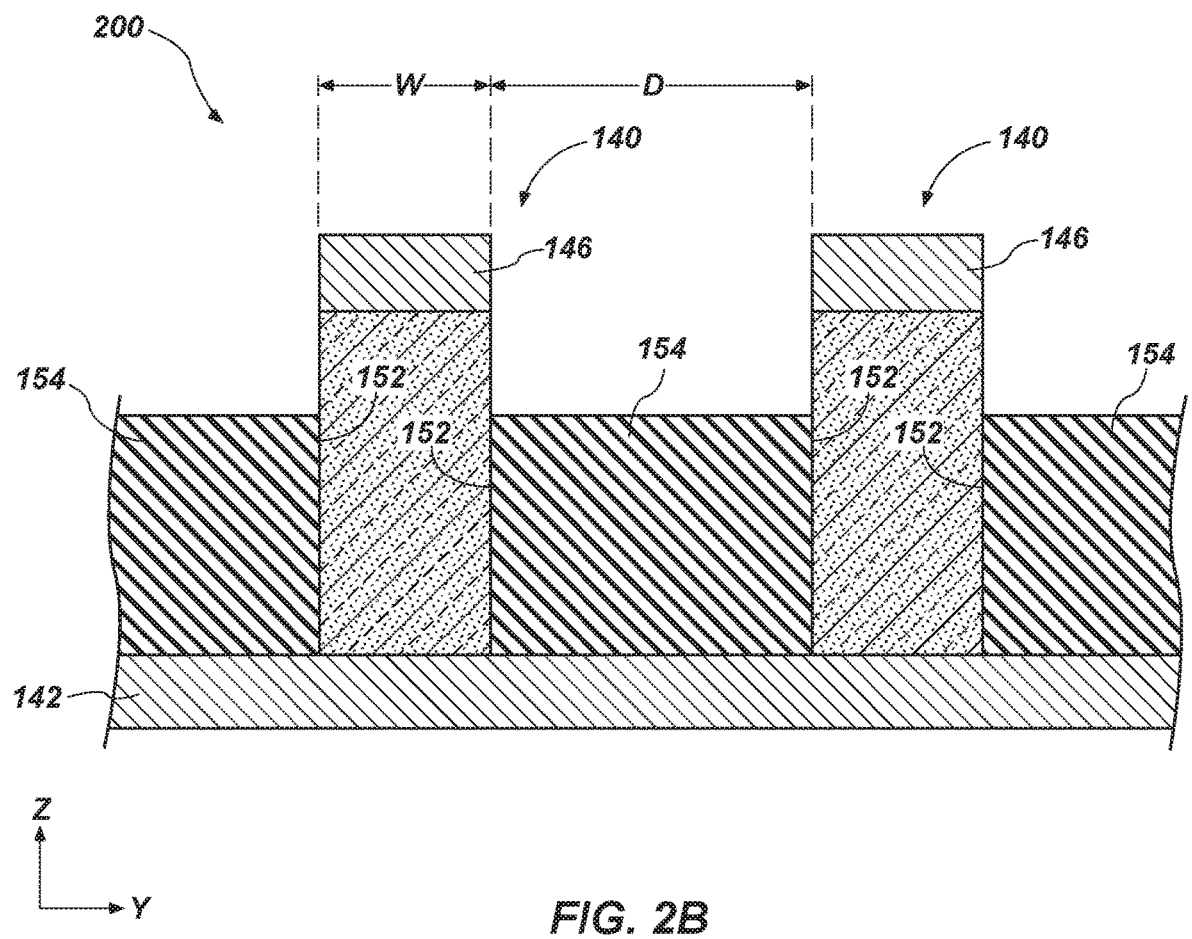
FIG. 2B is a simplified cross-sectional view of the array of vertical thin film transistors of FIG. 2A, taken along section line B-B of FIG. 2A.

FIG. 2B is a cross-sectional view of a vertical thin film transistor 140 taken through section line B-B of FIG. 2A. Adjacent vertical thin film transistors 140 may be isolated from each other by an insulative material 154. The insulative material 154 may comprise a dielectric material, such as silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, silicon nitride, silicon oxynitride, amorphous carbon, or a combination thereof. In some embodiments, the insulative material 154 comprises silicon dioxide.

A width W of the vertical thin film transistor 140 may be between about 5 nm and about 40 nm, such as between about 5 nm and about 10 nm, between about 10 nm and about 15 nm, between about 15 nm and about 20 nm, between about 20 nm and about 30 nm, or between about 30 nm and about 40 nm. In some embodiments, the width W may be equal to about 12 nm. In other embodiments, the width W may be equal to about 26 nm.

A distance D between adjacent vertical thin film transistors 140 in the cross-section of FIG. 2B may be between about 20 nm and about 100 nm, such as between about 20 nm and about 30 nm, between about 30 nm and about 40 nm, between about 40 nm and about 50 nm, between about 50 nm and about 75 nm, or between about 75 nm and about 100 nm. In some embodiments, the distance D may be equal to about 36 nm. In other embodiments, the distance D may be between about 70 nm and about 80 nm, such as about 73 nm.

In some embodiments, sidewalls 152 of the channel region 144 may be oriented at an angle of about 90° with respect to a major surface of the substrate 101 (FIG. 1). Stated another way, the sidewalls 152 may be oriented substantially perpendicularly to the major surface of the substrate 101 and may not exhibit substantial sloping. In some embodiments, the angle of the sidewalls 152 with respect to the major surface of the substrate 101 may be greater than about 88°, greater than about 89°, or may be substantially perpendicular thereto. The angle may be between about 80° and about 90°, such as between about 80° and about 85°, or between about 85° and about 90°. The angle may be between about 88° and about 89°, or between about 89° and about 90°. In some embodiments, the angle is greater than about 82.8°.

As will be described with reference to FIG. 3A through FIG. 3K, the vertical thin film transistors 140 may be formed in an array having a greater packing density (e.g., number of vertical thin film transistors 140 per unit area) than conventional semiconductor devices, and the angle between the sidewalls 152 and the major surface of the substrate 101 may be achieved by forming the channel region 144 using a dry etch process comprising hydrogen bromide.

Figure 3A:
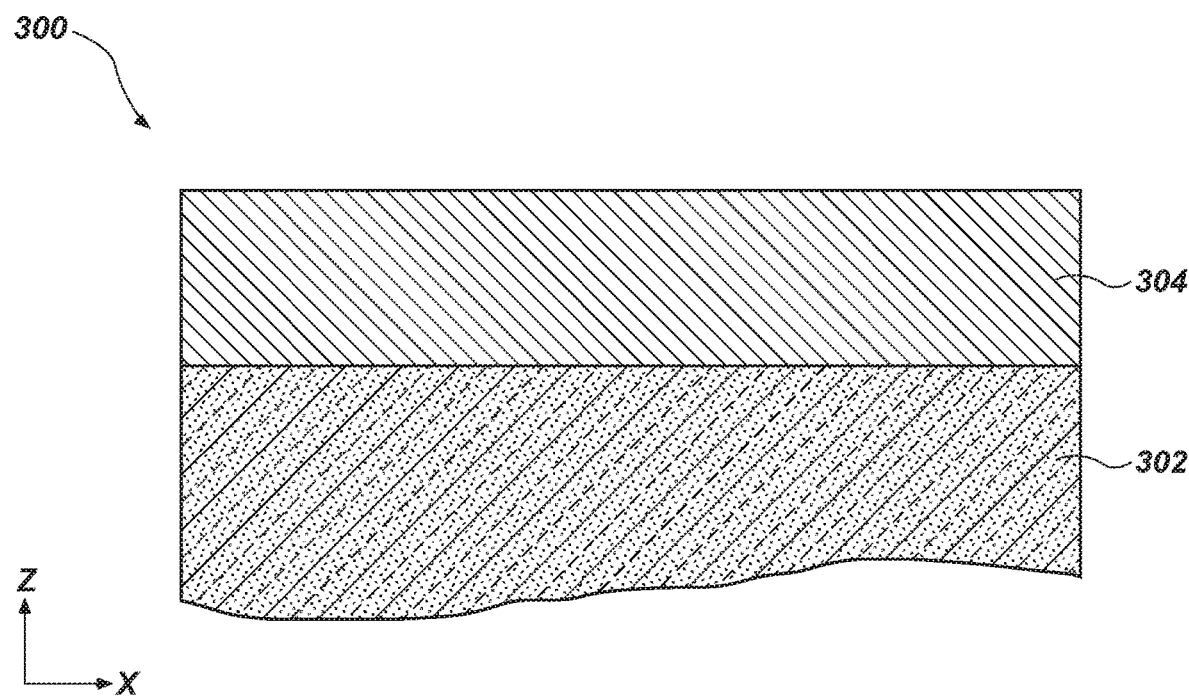
FIG. 3A through FIG. 3K illustrate a method of forming an array of vertical thin film transistors, in accordance with some embodiments of the disclosure.

FIG. 3A through FIG. 3K illustrate a method of forming the vertical thin film transistors 140 (FIG. 2A, FIG. 2B). With reference to FIG. 3A, a source material 304 may be formed over a substrate 302. The substrate 302 may include, for example, components of the logic circuitry region 102 described above with reference to FIG. 1. By way of nonlimiting example, the substrate 302 may include the conductive interconnects 106 (FIG. 1) that may be positioned and configured to make contact with the source material 304.

The source material 304 may include any material described above with reference to the source region 142 (FIG. 2A, FIG. 2B). By way of nonlimiting example, the source material 304 may include a metal, a combination of metals, or regions of different metals. For example, and without limitation, the source material 304 may include titanium nitride, copper, tungsten, tungsten nitride, molybdenum, polysilicon, other conductive materials, or combinations thereof.

Figure 3B:
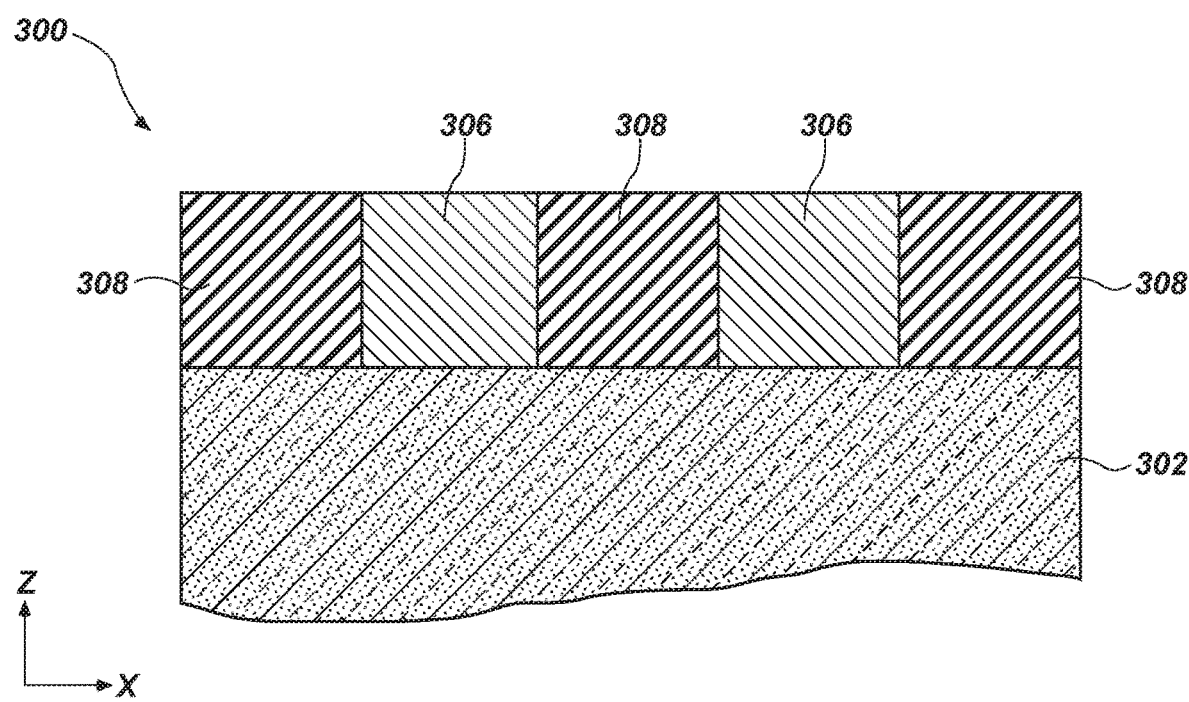

Referring to FIG. 3B, the source material 304 may be patterned to form source regions (e.g., source lines) 306 of the source material 304 (FIG. 3A). The source regions 306 may be arranged in, for example, rows extending in a first direction (e.g., a y-direction, perpendicular to the x-direction and into and out of the page in the cross-section illustrated in FIG. 3B) over the substrate 302. The source regions 306 may be patterned by, for example, forming a mask over the source material 304 (FIG. 3A), forming a pattern in the mask, such as by photolithography, and removing portions of the source material 304 through the mask. After forming the source regions 306 of the source material, a dielectric material 308 may be formed over the source regions 306 and in regions between the source regions 306. Dielectric material 308 may be removed from portions over the source regions 306, such as by chemical mechanical polishing (CMP). The dielectric material 308 may include silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, silicon nitride, silicon oxynitride, amorphous carbon, or a combination thereof.

Figure 3C:
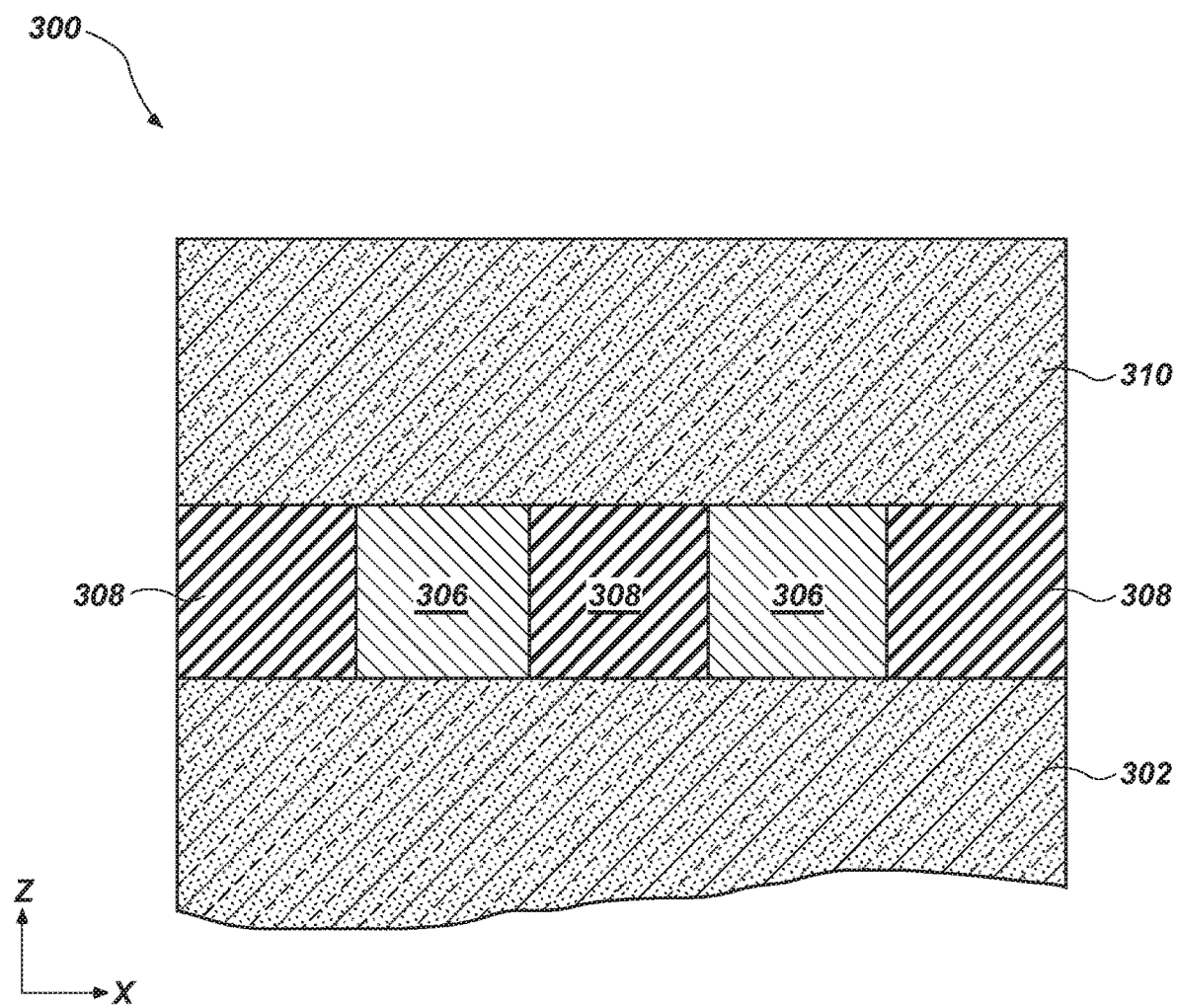

Referring to FIG. 3C, a channel material 310 may be formed over the dielectric material 308 and the source regions 306. The channel material 310 may include the same materials described above with reference to the channel region 144 of FIG. 2A. The channel material 310 may be formed by, for example, atomic layer deposition (ALD), chemical vapor deposition (CVD), low pressure chemical vapor deposition (LPCVD), plasma enhanced chemical vapor deposition (PECVD), physical vapor deposition (PVD), pulsed laser deposition (PLD), another deposition process, or combinations thereof.

Figure 3D:
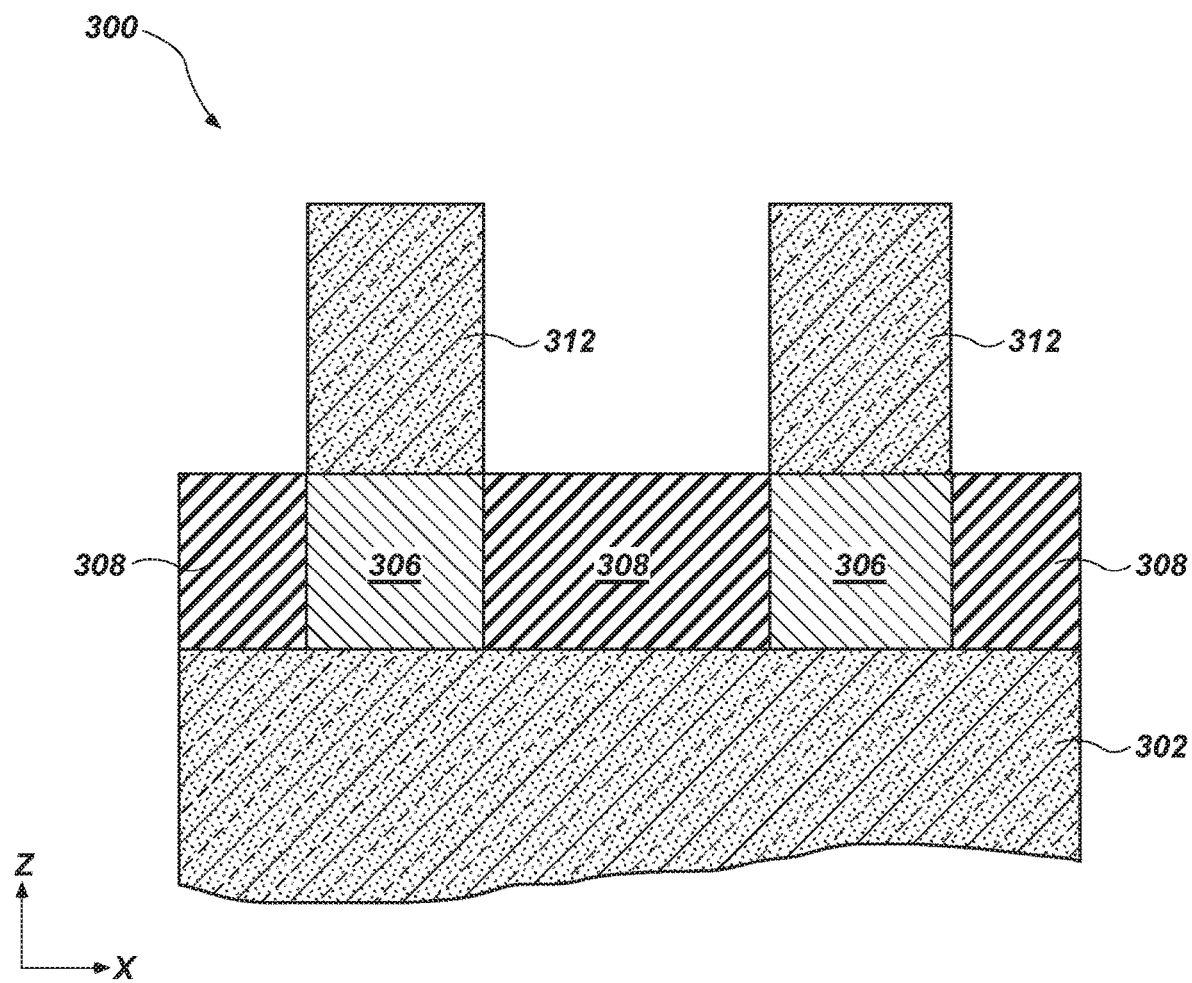

Referring to FIG. 3D, the channel material 310 may be patterned to form isolated lines of the channel material 310 over the source regions 306. In some embodiments, the channel material 310 may be patterned to form channel regions 312 directly over and in contact with the source regions 306. The channel regions 312 may be patterned such that adjacent portions of the channel regions 312 are separated from each other by a distance between about 10 nm and about 40 nm, such as between about 10 nm and about 15 nm, between about 15 nm and about 20 nm, between about 20 nm and about 25 nm, between about 25 nm and about 30 nm, or between about 30 nm and about 40 nm. In some embodiments, adjacent portions of the channel regions 312 may be separated from each other a distance of about 24 nm.

The channel material 310 may be patterned by dry etching the channel material 310 to remove portions of the channel material 310 and form the channel regions 312 with a desired pitch, width, and spacing. In some embodiments, a mask comprising, for example, a carbon material (e.g., amorphous carbon) is formed in a desired pattern over the channel material 310. Portions of the channel material 310 may be removed through the mask with an anisotropic etch, such as an anisotropic dry etch. By way of nonlimiting example, the channel regions 312 may be patterned by reactive ion etching (RIE), plasma etching, another dry etching method, etc.

Suitable etchant gases may include hydrogen bromide (HBr), one or more alkanes or alkenes (e.g., $CH_4$, $C_2H_6$, etc.), a halogen-based etchant, $Cl_2$, $CF_4$, and $CH_2O_2$, tetrafluoromethane ($CF_4$), octafluoropropane ($C_3F_8$), octafluorocyclobutane ($C_4F_8$), hexafluorobutadiene ($C_4F_6$), octafluorocyclopentene ($C_5F_8$), fluoroform ($CHF_3$), difluoromethane ($CH_2F_2$), sulfur hexafluoride ($SF_6$), nitrogen trifluoride ($NF_3$), chlorine trifluoride ($ClF_3$), chlorine ($Cl_2$), boron trichloride ($BCl_3$), and trifluoroiodomethane ($CF_3I$), $CF_4$, $C_3F_8$, $C_4F_8$, $C_4F_6$, $CHF_3$, $CH_2F_2$, $SF_6$, $NF_3$, $ClF_3$, HBr, $Cl_2$, $BCl_3$, and $CF_3I$. The etchant gas may further include at least one carrier, such as nitrogen, argon, helium, oxygen, or combinations thereof.

In some embodiments, the etchant gas comprises a hydrogen bromide-containing gas. The hydrogen bromide-containing gas may include hydrogen bromide, a carrier gas, and one or more of methane ($CH_4$), hydrogen ($H_2$), oxygen ($O_2$), and nitrogen trifluoride. In some embodiments, the etchant gas comprises hydrogen bromide, argon, methane, and hydrogen. In some such embodiments, the etchant gas may comprise between about 0.1 part and about 5.0 parts methane for about every 1.0 part hydrogen bromide, such as between about 0.1 part and about 0.5 part, between about 0.5 part and about 1.0 part, between about 1.0 part and about 2.0 parts, or between about 2.0 parts and about 5.0 parts methane for about every 1.0 part hydrogen bromide. In some embodiments, the etchant gas comprises about 1.0 part hydrogen bromide for about every 1.0 part methane. In other embodiments, the etchant gas comprises about 1.0 part hydrogen bromide for about every 2.0 parts methane. In yet other embodiments, the etchant gas comprises about 1.0 part hydrogen bromide for about every 0.30 part methane.

The etchant gas may comprise between about 0.1 part and about 5.0 parts hydrogen for about every 1.0 part hydrogen bromide, such as between about 0.1 part and about 0.5 part, between about 0.5 part and about 1.0 part, between about 1.0 part and about 2.0 parts, or between about 2.0 parts and about 5.0 parts hydrogen for about every 1.0 part hydrogen bromide. In some embodiments, the etchant gas comprises about 1.0 part hydrogen bromide for about every 1.0 part hydrogen.

The etchant gas may comprise between about 0.1 part and about 5.0 parts carrier gas (e.g., argon) for about every 1.0 part hydrogen bromide, such as between about 0.1 part and about 0.5 part, between about 0.5 part and about 1.0 part, between about 1.0 part and about 2.0 parts, or between about 2.0 parts and about 5.0 parts of the carrier gas for about every 1.0 part hydrogen bromide. In some embodiments, the etchant gas comprises about 1.0 part hydrogen bromide for about every 0.5 part of the carrier gas. In other embodiments, the etchant gas comprises about 4.0 parts hydrogen bromide for about every 1.0 part of the carrier gas, such as where the carrier gas comprises helium.

The etchant gas may comprise between about 0.1 part and about 10.0 parts hydrogen bromide for about every 1.0 part oxygen, such as between about 0.1 part and about 0.5 part, between about 0.5 part and about 1.0 part, between about 1.0 part and about 2.0 parts, between about 2.0 parts and about 5.0 parts, or between about 5.0 parts and about 10.0 parts of the hydrogen bromide for about every 1.0 part oxygen. In some embodiments, the etchant gas comprises about 1.0 part oxygen for about every 5.0 parts hydrogen bromide.

In some embodiments, the etchant gas comprises or consists essentially of hydrogen bromide. In other embodiments, the etchant gas comprises or consists essentially of hydrogen bromide and a carrier gas (e.g., nitrogen, argon, helium, oxygen, and combinations thereof). In some embodiments, the etchant gas comprises or consists essentially of hydrogen bromide and argon.

In yet other embodiments, the etchant gas comprises or consists essentially of hydrogen bromide, an alkane (e.g., methane), and a carrier gas. In some embodiments, the etchant gas comprises hydrogen bromide, methane, hydrogen, and argon. In some such embodiments, the etchant gas may include a ratio of hydrogen bromide:methane:hydrogen:argon of about 60:60:60:32.

In some embodiments, the etchant gas comprises hydrogen bromide, methane, helium, and oxygen. In some such embodiments, the etchant gas comprises a ratio of hydrogen bromide:methane:helium:oxygen of about 50:100:12:10.

In further embodiments, the etchant gas comprises hydrogen bromide, argon, hydrogen, methane, and nitrogen trifluoride. In some such embodiments, the etchant gas comprises a ratio of hydrogen bromide:argon:hydrogen:methane:nitrogen trifluoride of about 200:200:200:60:20.

A bias voltage may be applied during the patterning process. In some embodiments, the bias voltage is between about 200 V and about 2,500 V, such as between about 200 V and about 400 V, between about 400 V and about 600 V, between about 600 V, and about 800 V, between about 800 V and about 1,000 V, between about 1,000 V and about 1,250 V, between about 1,250 V and about 1,500 V, between about 1,500 V and about 2,000 V, or between about 2,000 V and about 2,500 V. In some embodiments, the bias voltage may be pulsed. In some embodiments, the bias voltage may be greater than about 500 V, greater than about 1,000 V, greater than about 1,500 V, or greater than about 2,000 V.

During the patterning process, a source radiofrequency (RF) power may be between about 150 W and about 1,500

W, such as between about 150 W and about 250 W, between about 250 W and about 500 W, between about 500 W and about 1,000 W, or between about 1,000 W and about 1,500 W.

During the patterning process, a pressure of the etch chamber may be between about 1.0 mtorr and about 10.0 mtorr, such as between about 1.0 mtorr and about 2.0 mtorr, between about 2.0 mtorr and about 5.0 mtorr, between about 5.0 mtorr and about 8.0 mtorr, or between about 8.0 mtorr and about 10.0 mtorr.

During the patterning process, a temperature of the etch chamber may be greater than a volatilization temperature of etch byproducts, such as $Zn(CH_3)_2$. In some such embodiments, the temperature may be greater than about 46° C., such as greater than about 50° C. The temperature may be between about 20° C. and about 250° C., such as between about 20° C. and about 50° C., between about 50° C. and about 100° C., between about 100° C. and about 150° C., between about 150° C. and about 200° C., or between about 200° C. and about 250° C.

In some embodiments, the channel regions 312 may be patterned by exposing the channel material 310 to a mixture of the etchant gas in a so-called "one-step" etch. In other embodiments, the channel material 310 may be exposed to different compositions of the etchant gas. For example, the channel material 310 may be exposed to alternating etch compositions including a first composition comprising hydrogen bromide and a carrier gas and a second composition including one or more gases configured to reduce or prevent polymer formation. In some such embodiments, a first composition comprising hydrogen bromide, methane, and a carrier gas may be cycled to remove the channel material 310. After exposing the channel material 310 to the first composition, the channel material 310 may be exposed to a second gas composition comprising a carrier gas and one or more of hydrogen, oxygen, and nitrogen trifluoride. In some embodiments, a bias voltage may not be applied while exposing the channel material 310 to the second gas composition. Patterning the channel material 310 may include performing multiple cycles of exposure to the first gas composition, followed by exposure to the second gas composition.

Without wishing to be bound by any particular theory, it is believed that the combination of methane, hydrogen bromide, hydrogen, and nitrogen trifluoride facilitates patterning of the channel material 310 and maintaining a critical dimension of the channel regions 312. It is believed that the methane etches the channel material 310 and preserves the mask material (e.g., carbon). Hydrogen may also etch the channel material 310 and may reduce or substantially prevent an amount of polymer that may be formed by the methane etchant. In addition, nitrogen trifluoride reduces an amount of polymer that may be formed by the methane. It is believed that applying a high bias voltage (e.g., a bias voltage greater than about 400 V) with pulsing may facilitate formation of substantially vertical sidewalls and may substantially reduce or eliminate formation of polymer byproducts that often accompany alkane-based etchants.

Patterning the channel regions 312 with the hydrogen bromide-containing etchant may facilitate formation of the channel regions 312 with a higher packing density than that formed in conventional semiconductor devices. Surprisingly, patterning the channel regions 312 with the hydrogen bromide-containing gas forms the channel regions 312 with substantially vertical sidewalls (e.g., sidewalls having an angle between, for example, about 80° and about 90° with respect to the major surface of the substrate 302). Since the channel regions 312 are formed with substantially vertical sidewalls with the hydrogen bromide-containing etchant, a packing density of the channel regions 312 may be increased. The sidewalls of the channel regions 312 may exhibit smooth a smooth and clean surface. By way of comparison, oxide semiconductors etched with other etchants such as boron trichloride ($BCl_3$) often exhibit a relatively high surface roughness and the etchant is unable to achieve desired packing densities in some semiconductor structures. Etch chemistries that are formed primarily of an alkane may leave a residue on surfaces of the channel regions 312. In some embodiments, such etchants may undesirably alter chemical and electrical properties of the channel region 312. Surprisingly, patterning the channel region 312 with the hydrogen bromide-containing gas including an alkane does not form a residue on surfaces of the channel regions 312.

Figure 3E:
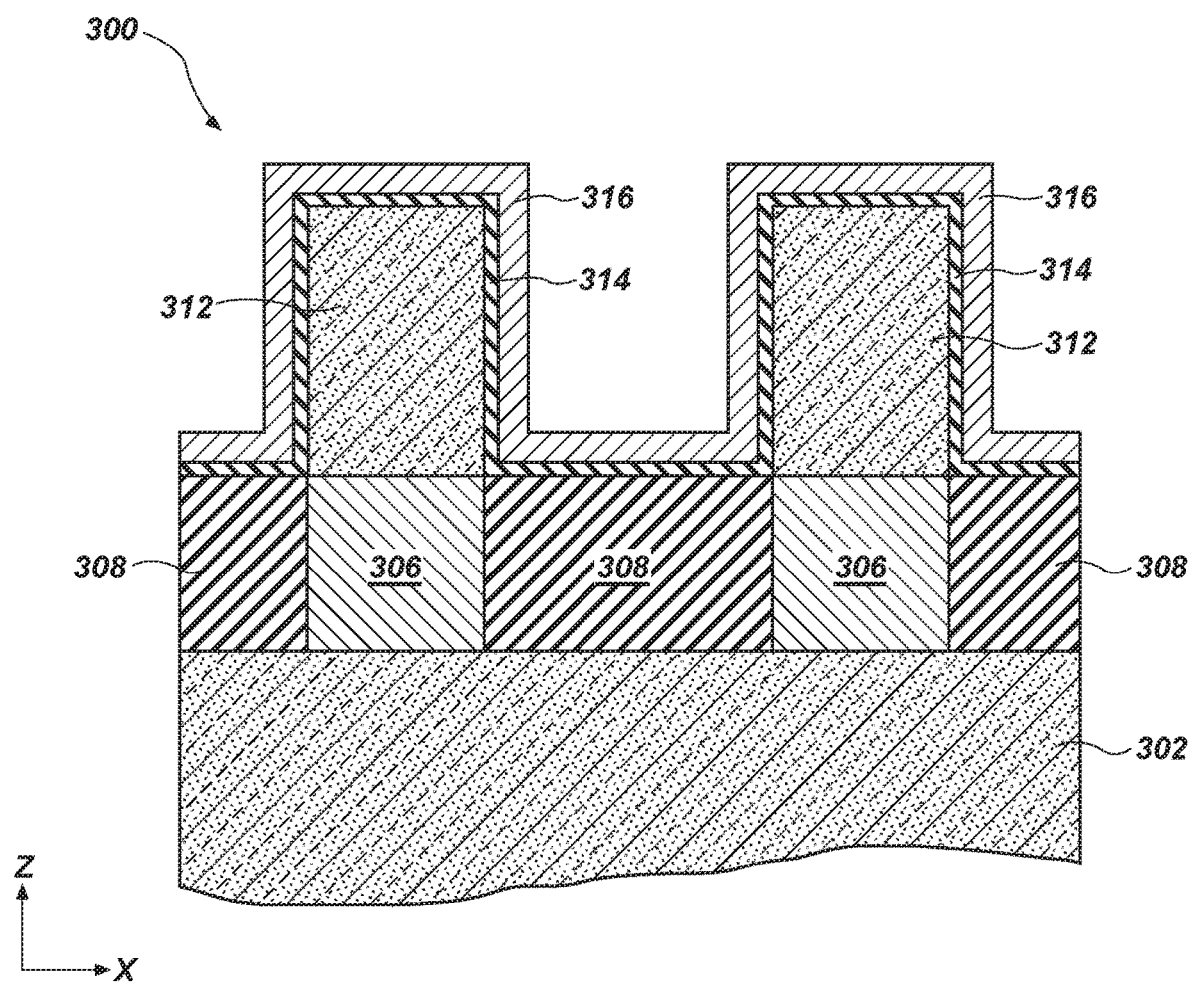

Referring to FIG. 3E, a gate dielectric material 314 may be formed conformally over the semiconductor structure 300, such as over the channel regions 312 and in spaces between the channel regions 312. The gate dielectric material 314 may include any of the gate dielectric materials 148 described above with reference to FIG. 2A and FIG. 2B. In some embodiments, the gate dielectric material 314 comprises an oxide material. The gate dielectric material 314 may be formed by ALD, CVD, LPCVD, PECVD, PVD, another method, or combinations thereof.

After forming the gate dielectric material 314, a gate electrode material 316 may be formed adjacent to (e.g., over) the gate dielectric material 314. The gate electrode material 316 may be formed over the gate dielectric material 314. The gate electrode material 316 may include any materials of the gate electrode 150 described above with reference to FIG. 2A and FIG. 2B. In some embodiments, the gate electrode material 316 comprises titanium nitride. The gate electrode material 316 may be formed by ALD, CVD, LPCVD, PECVD, PVD, another method, or combinations thereof.

Figure 3F:
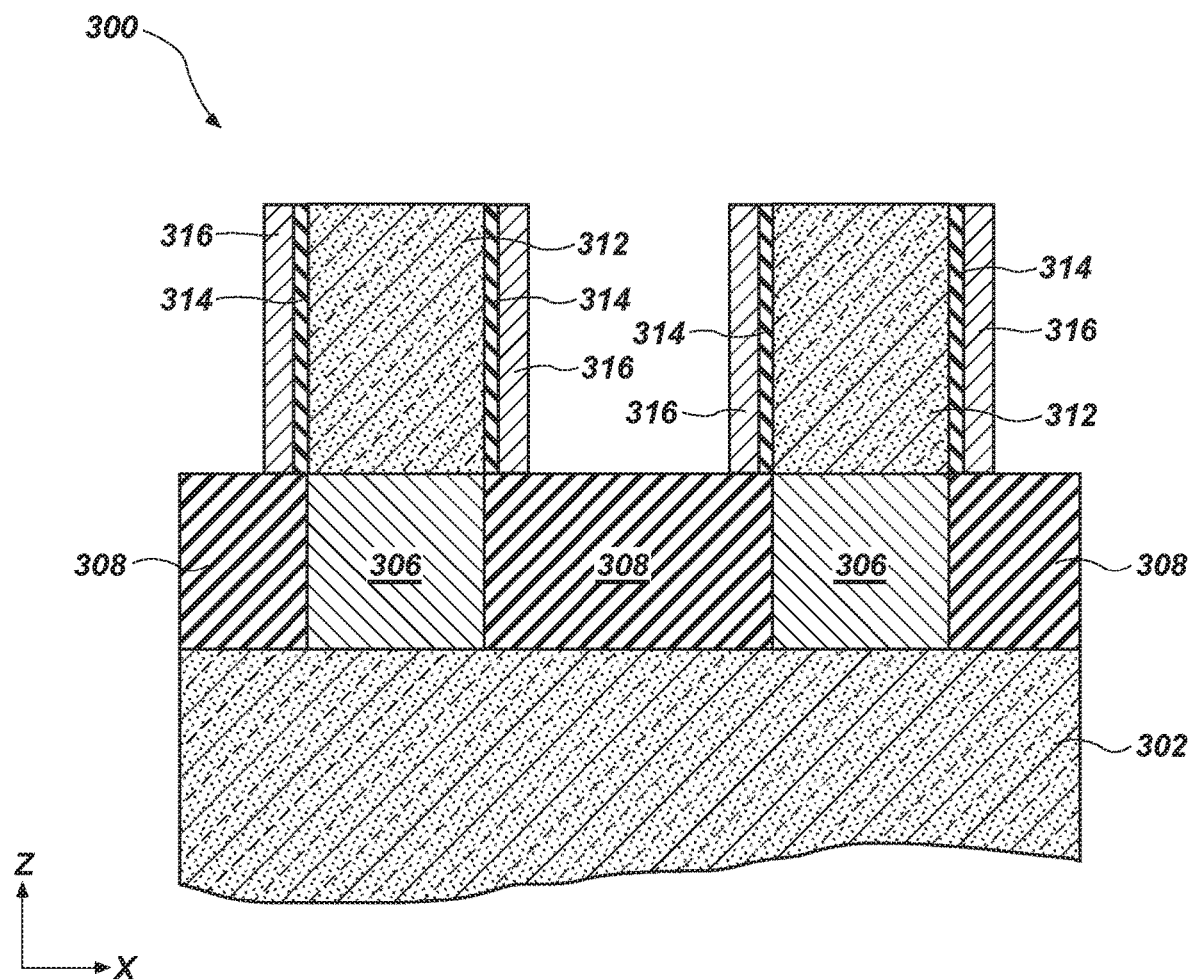

Referring to FIG. 3F, after forming the gate dielectric material 314 and the gate electrode material 316, the gate dielectric material 314 and the gate electrode material 316 may be patterned. In some embodiments, the gate electrode material 316 may be removed from laterally extending surfaces (e.g., surfaces extending substantially parallel with the major surface of the substrate 302). The gate electrode material 316 may be removed by methods such as dry etching, wet etching, or a combination thereof. In some embodiments, the gate electrode material 316 is removed by exposing the gate electrode material 316 to a dry etch, such as by reactive ion etching. The gate electrode material 316 may remain on the gate dielectric material 314 on sidewalls of the channel regions 312. In some embodiments, the gate electrode material 316 may extend to a surface of the dielectric material 308 and may be electrically isolated from the source region 306.

After patterning the gate electrode material 316, the gate dielectric material 314 may be patterned. Portions of the gate dielectric material 314 may be removed to form the gate dielectric material 314 extending from the dielectric material 308 on sidewalls of the channel region 312 to an upper surface of the channel region 312. The gate dielectric material 314 may electrically isolate the channel region 312 from the gate electrode material 316. A portion of the channel region 312 may remain exposed through the gate dielectric material 314.

Figure 3G:
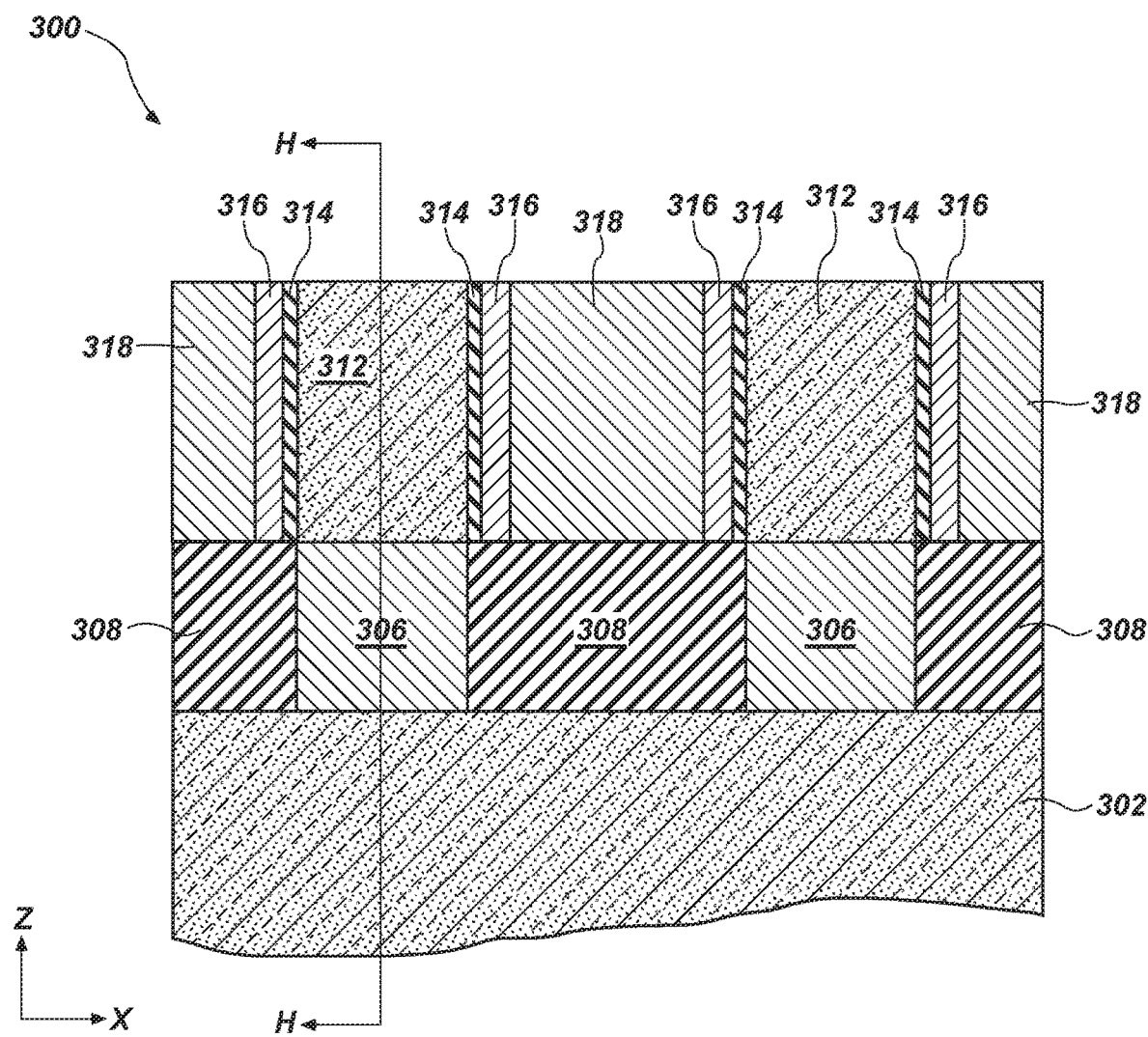

Referring to FIG. 3G, a conductive line 318 may be formed in electrical communication with the gate electrode material 316. In some embodiments, the conductive line 318 comprises a conductive word line and is substantially the same as the conductive word line 160 described above with reference to FIG. 2A. The conductive line 318 may include a conductive material such as polysilicon, conductively doped silicon, tungsten, tungsten nitride, nickel, tantalum, tantalum nitride, tantalum silicide, platinum, copper, silver, gold, aluminum, molybdenum, titanium, titanium nitride, titanium silicide, titanium aluminum nitride, molybdenum nitride, iridium, iridium oxide, ruthenium, ruthenium oxide, and combinations thereof. In some embodiments, the conductive line 318 includes titanium nitride.

Figure 3H:
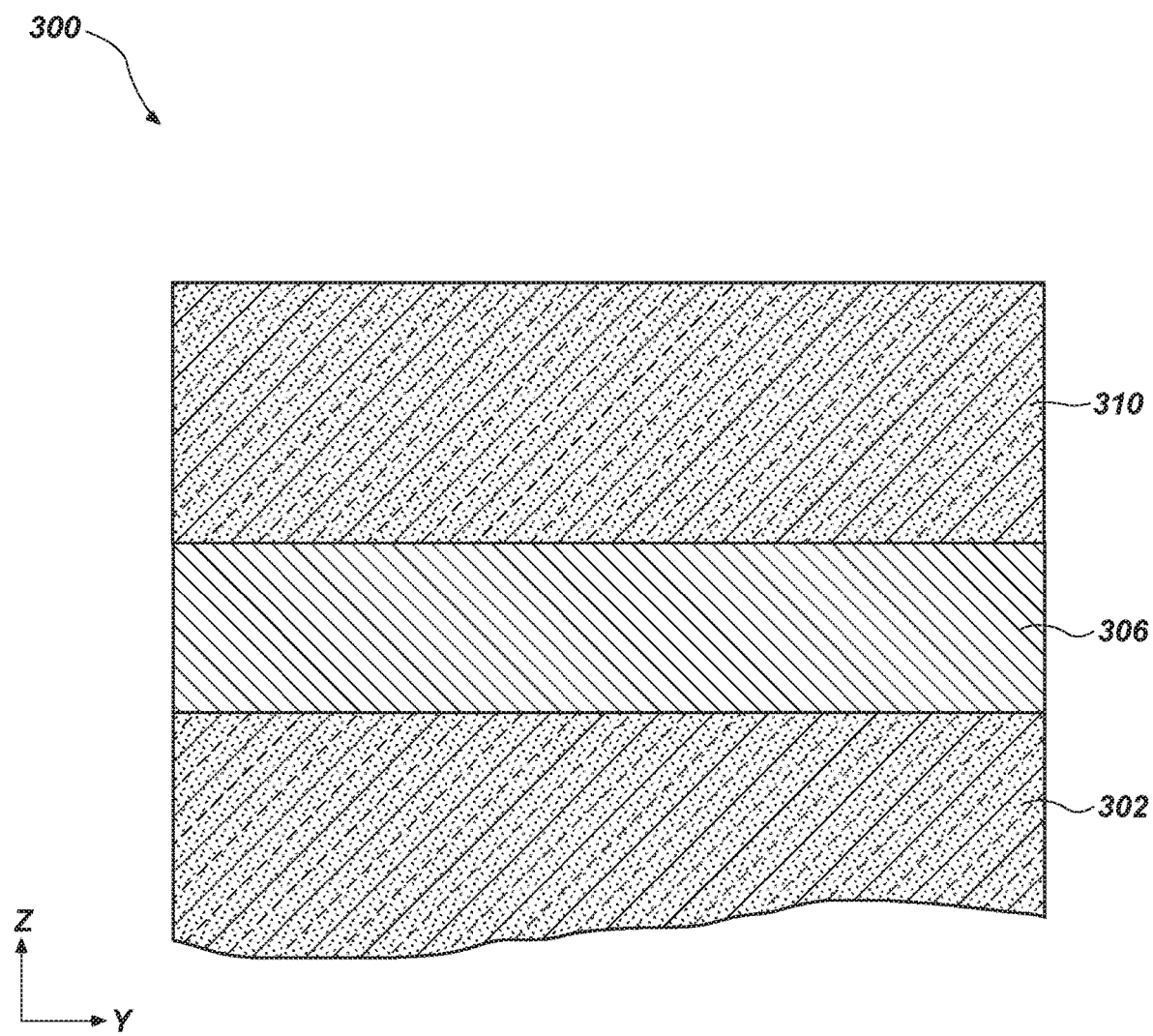
Figure 3I:
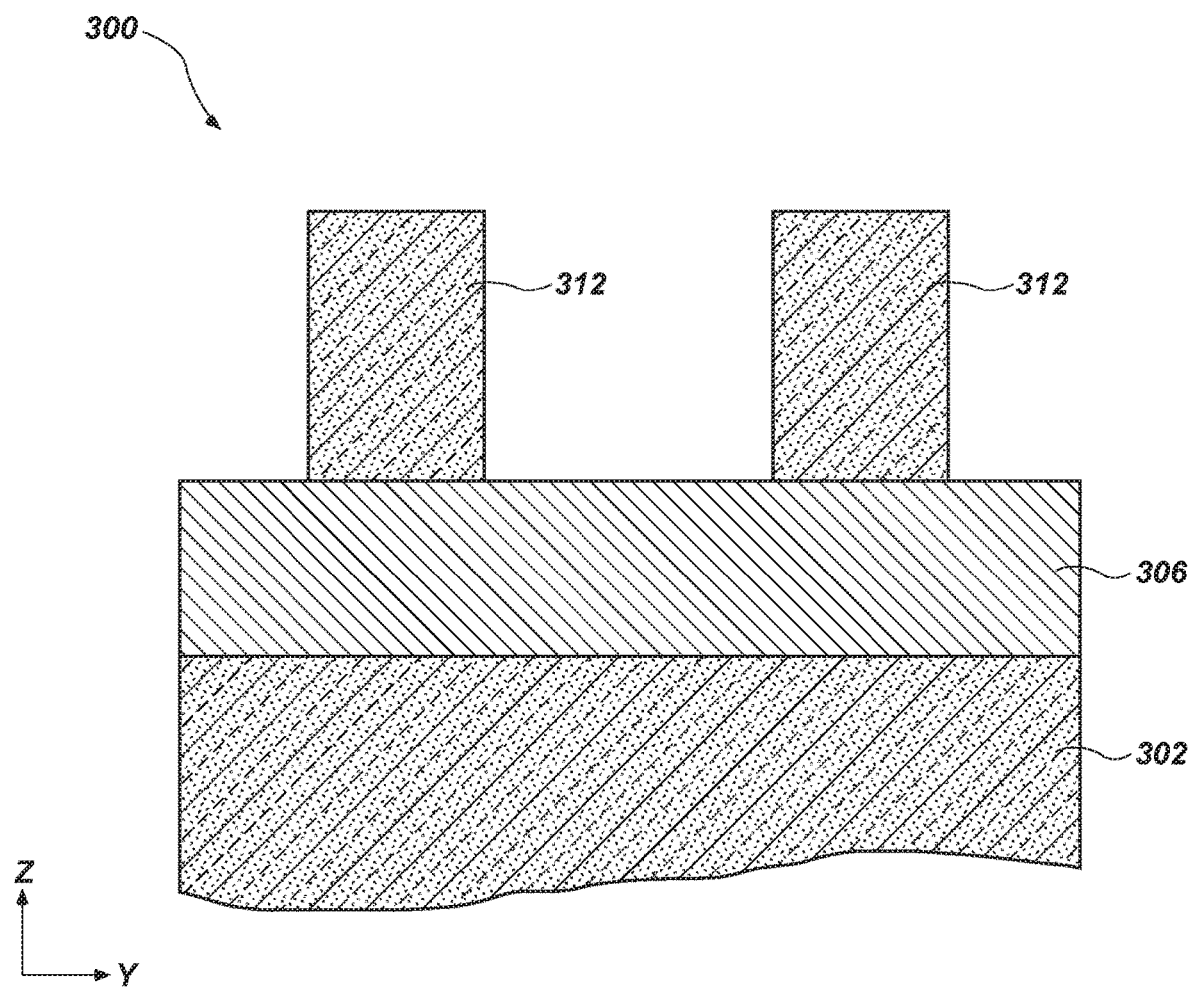

FIG. 3H is a cross-sectional view of the semiconductor structure 300 taken along section line H-H of FIG. 3G. The semiconductor structure 300 may include a stack of the source regions 306 and the channel material 310. Referring to FIG. 3I, portions of the channel regions 312 may be removed in a second direction to pattern the channel regions 312 in a second direction (e.g., in the y-direction). The channel region 312 may be patterned as described above with reference to FIG. 3D. By way of nonlimiting example, the channel material 310 may be exposed to a dry etchant comprising a hydrogen bromide-containing gas.

Figure 3J:
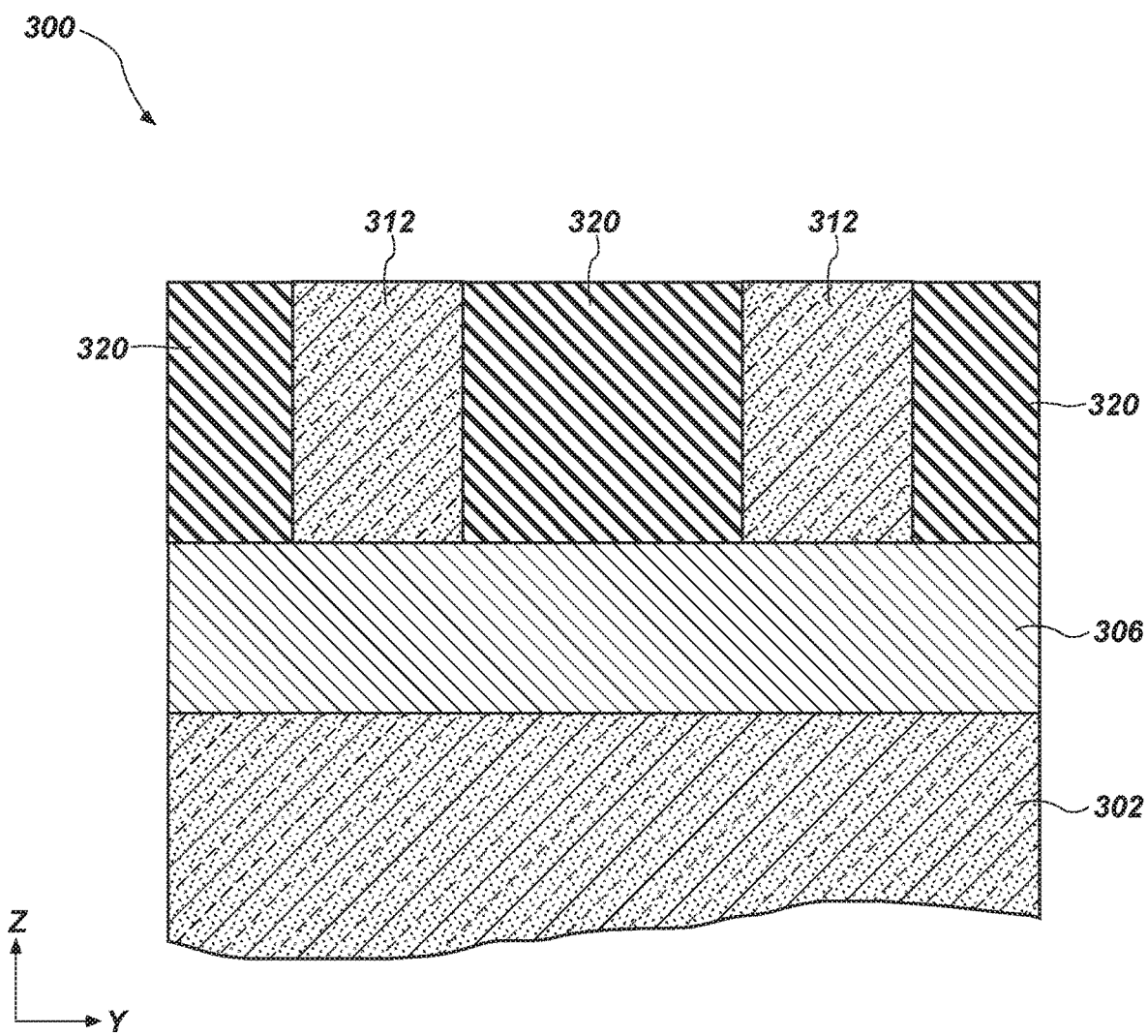

Referring to FIG. 3J, an insulative material 320 may be formed and patterned over the semiconductor structure 300. The insulative material 320 may be patterned to fill spaces between adjacent channel regions 312. The insulative material 320 may include silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, silicon nitride, silicon oxynitride, amorphous carbon, or a combination thereof.

Figure 3K:
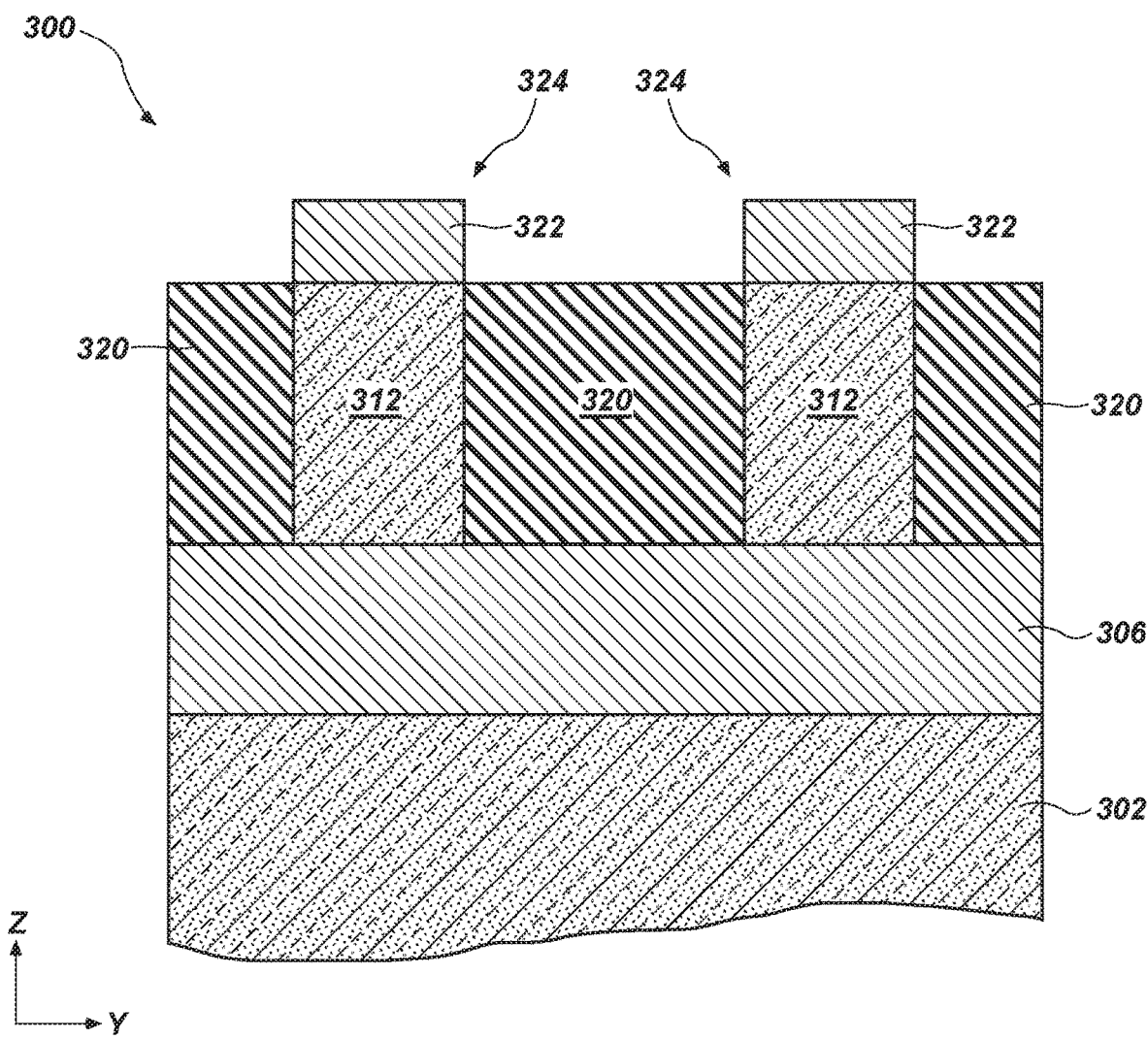

With reference to FIG. 3K, a drain material may be formed over the semiconductor structure 300 to form drain regions 322 over and in direct contact with the channel regions 312 and form vertical thin film transistors 324. The drain material may be patterned to form vertical thin film transistor as described above with reference to FIG. 2A and FIG. 2B.

The drain regions 322 may be formed by forming a conductive material over the semiconductor structure 300, such as over the channel regions 312 and in regions between adjacent channel regions 312. The drain regions 322 may be patterned over the channel regions 312. The drain regions 322 may be patterned by, for example, a wet etch, a dry etch, or a combination thereof. By way of nonlimiting example, portions of the drain region 322 to be removed may be exposed to an etch solution through a mask to remove exposed portions thereof. In other embodiments, portions of the drain region 322 to be removed may be exposed to a reactive ion etching process to remove such portions. With reference to FIG. 3K and FIG. 1, the drain regions 322 may be configured to be in electrical communication with, for example, the first electrode 132 of the capacitor structure 130. Accordingly, the vertical thin film transistors 324 may be in electrical communication with the capacitor region 108 through the drain regions 322.

After forming the drain regions 322, additional processing may be performed to form a complete semiconductor structure, such as the semiconductor device 100 described above with reference to FIG. 1. By way of nonlimiting example, the capacitor structures 130 (FIG. 1) may be formed over the drain regions 322 to electrically connect each vertical thin film transistor 324 with a capacitor structure 130. The interconnect region 110 (FIG. 1) may be formed by methods understood by those of ordinary skill in the art.

The resulting semiconductor structure may include an array of vertical thin film transistors including an oxide semiconductor channel material. The array of vertical thin film transistors according to embodiments of the disclosure may be more closely packed than in conventional semiconductor structures, may have substantially vertical sidewalls, and may be substantially free of etch residue that is common in conventional semiconductor structures.

Accordingly, in some embodiments, a method of forming a semiconductor structure comprises forming an array of vertical thin film transistors. Forming the array of vertical thin film transistors comprises forming a source region, forming a channel material comprising an oxide semiconductor material over the source region, exposing the channel material to a dry etchant comprising hydrogen bromide to pattern the channel material into channel regions of adjacent vertical thin film transistor structures, forming a gate dielectric material on sidewalls of the channel regions, forming a gate electrode material over the gate dielectric material, and forming a drain region over the channel regions.

Accordingly, in some embodiments, a method of forming a semiconductor structure comprises forming conductive source lines, patterning a channel material comprising an oxide semiconductor material over the conductive source lines to form rows of the channel material extending in a first direction, wherein patterning the channel material comprises exposing the channel material to a dry etchant comprising a hydrogen bromide-containing gas, forming a gate oxide on sidewalls of the rows of the channel material, forming a gate electrode over the gate oxide, and patterning the rows of the channel material to form isolated channel regions comprising vertical thin film transistors.

Accordingly, in other embodiments, a method of forming an array of memory cells comprises forming an array of vertical thin film transistors. Forming the array of vertical thin film transistors comprises exposing a channel material comprising an oxide semiconductor material over a conductive source material to a dry etchant comprising hydrogen bromide to form rows of the channel material, forming a gate oxide on sidewalls of the rows of the channel material, forming a gate electrode over the gate oxide, exposing the rows of the channel material to the dry etchant to form isolated vertical thin film transistor structures, and forming a drain region over the channel material of each of the isolated vertical thin film transistors. The method further comprises forming a capacitor structure over and in contact with the drain region of each of the isolated vertical thin film transistors.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a device, the method comprising:
    forming transistors over a control logic region, forming the transistors comprising:
        forming source regions adjacent to the control logic region;

forming an oxide semiconductor material adjacent to the source regions;
exposing the oxide semiconductor material to a dry etchant comprising hydrogen bromide to form channel regions adjacent to the source regions; and
forming drain regions adjacent to the channel regions; and
forming capacitors adjacent to the transistors.

2. The method of claim 1, wherein exposing the oxide semiconductor material to a dry etchant comprising hydrogen bromide to form channel regions adjacent to the source regions comprises forming the channel regions to have a pitch from about 10 nm to about 40 nm.

3. The method of claim 1, wherein exposing the oxide semiconductor material to a dry etchant comprising hydrogen bromide comprises exposing the oxide semiconductor material to the dry etchant while applying a bias voltage within a range from about 200 V to about 2,500 V.

4. The method of claim 1, wherein exposing the oxide semiconductor material to a dry etchant comprising hydrogen bromide comprises exposing the oxide semiconductor material to the dry etchant comprising hydrogen bromide, methane, and a carrier gas.

5. The method of claim 1, wherein exposing the oxide semiconductor material to a dry etchant comprising hydrogen bromide to form channel regions adjacent to the source regions comprises forming sidewalls of the channel regions exhibiting an angle between about 80° and about 90° with respect to a major surface of a base material.

6. The method of claim 1, wherein exposing the oxide semiconductor material to a dry etchant comprising hydrogen bromide to form channel regions adjacent to the source regions comprises forming sidewalls of the channel regions exhibiting an angle between about 85° and about 90° with respect to a major surface of a base material.

7. The method of claim 1, wherein exposing the oxide semiconductor material to a dry etchant comprising hydrogen bromide comprises exposing the oxide semiconductor material to the dry etchant in an etch chamber having a temperature greater than about 50° C.

8. The method of claim 1, wherein exposing the oxide semiconductor material to a dry etchant comprising hydrogen bromide comprises exposing the oxide semiconductor material to a dry etchant comprising hydrogen bromide and one or more alkanes.

9. The method of claim 1, wherein exposing the oxide semiconductor material to a dry etchant comprising hydrogen bromide comprises exposing the oxide semiconductor material to a dry etchant comprising hydrogen bromide and one or more of methane, hydrogen, oxygen, and nitrogen trifluoride.

10. The method of claim 1, wherein exposing the oxide semiconductor material to a dry etchant comprising hydrogen bromide comprises exposing the oxide semiconductor material to a dry etchant comprising from about 0.1 part to about 5.0 parts methane for every about 1.0 part hydrogen bromide.

11. The method of claim 1, wherein exposing the oxide semiconductor material to a dry etchant comprising hydrogen bromide comprises exposing the oxide semiconductor material to a dry etchant comprising from about 0.1 part to about 10.0 parts hydrogen bromide for every about 1.0 part oxygen.

12. The method of claim 1, wherein exposing the oxide semiconductor material to a dry etchant comprising hydrogen bromide comprises exposing the oxide semiconductor material to a dry etchant comprising hydrogen bromide, argon, methane, and hydrogen.

13. The method of claim 1, wherein exposing the oxide semiconductor material to a dry etchant comprising hydrogen bromide comprises exposing the oxide semiconductor material to a dry etchant consisting essentially of hydrogen bromide.

14. The method of claim 1, further comprising exposing the oxide semiconductor material to one or more of hydrogen, oxygen, and nitrogen trifluoride after exposing the oxide semiconductor material to the dry etchant comprising hydrogen bromide.

15. The method of claim 14, wherein exposing the oxide semiconductor material to one or more of hydrogen, oxygen, and nitrogen trifluoride after exposing the oxide semiconductor material to the dry etchant comprising hydrogen bromide comprises exposing the oxide semiconductor material to the one or more of hydrogen, oxygen, and nitrogen trifluoride without applying a bias voltage.

16. The method of claim 1, wherein forming transistors over a control logic region comprises forming the channel regions to have a height between about 40 nm and about 100 nm.

17. The method of claim 1, wherein forming transistors over a control logic region comprises forming the channel regions to have a width from about 5 nm to about 40 nm.

18. The method of claim 1, wherein exposing the oxide semiconductor material to a dry etchant comprising hydrogen bromide comprises exposing the oxide semiconductor material to a dry etchant comprising hydrogen bromide and one or more of at least one alkane, at least one alkene, and a halogen-based etchant.

19. The method of claim 1, wherein exposing the oxide semiconductor material to a dry etchant comprising hydrogen bromide comprises sequentially exposing the oxide semiconductor material to the dry etchant comprising hydrogen bromide and a second gas composition comprising one or more of hydrogen, oxygen, and nitrogen trifluoride.

20. The method of claim 1, wherein exposing the oxide semiconductor material to a dry etchant comprises exposing the oxide semiconductor material to a dry etchant while applying a power between about 150 W and about 1,500 W.

21. A method of forming a device, the method comprising:
forming transistors over a control logic region, forming the transistors comprising:
forming an oxide semiconductor material over source regions overlying the control logic region;
exposing the oxide semiconductor material to a dry etchant comprising hydrogen bromide to form channel regions over the source regions; and
forming drain regions over the channel regions; and
forming capacitors adjacent to the transistors.

* * * * *

UNITED STATES PATENT AND TRADEMARK OFFICE
CERTIFICATE OF CORRECTION

PATENT NO. : 11,276,613 B2
APPLICATION NO. : 16/917379
DATED : March 15, 2022
INVENTOR(S) : Kevin J. Torek It is certified that error appears in the above-identified patent and that said Letters Patent is hereby corrected as shown below:

In the Specification
Column 9, Line 44, change "$BC_{13}$" to --$BCl_3$--

Signed and Sealed this
Twenty-sixth Day of April, 2022

Katherine Kelly Vidal
*Director of the United States Patent and Trademark Office*